(12) United States Patent
Banerjee et al.

(10) Patent No.: US 7,056,391 B2
(45) Date of Patent: Jun. 6, 2006

(54) LIQUID-ASSISTED CRYOGENIC CLEANING

(75) Inventors: Souvik Banerjee, Fremont, CA (US); Harlan Forrest Chung, Castro Valley, CA (US)

(73) Assignee: BOC, Inc., Murray Hill, NJ (US)

( * ) Notice: Subject to any disclaimer, the term of this patent is extended or adjusted under 35 U.S.C. 154(b) by 0 days.

(21) Appl. No.: 10/886,251

(22) Filed: Jul. 7, 2004

(65) Prior Publication Data

US 2004/0255984 A1 Dec. 23, 2004

Related U.S. Application Data

(63) Continuation of application No. 10/324,221, filed on Dec. 19, 2002, now Pat. No. 6,852,173.

(60) Provisional application No. 60/369,853, filed on Apr. 5, 2002.

(51) Int. Cl.
*B08B 3/00* (2006.01)

(52) U.S. Cl. .............. 134/26; 134/33; 134/36; 134/7; 134/1.3

(58) Field of Classification Search .......... 134/6, 134/7, 26, 34, 37, 1, 3, 33, 36
See application file for complete search history.

(56) References Cited

U.S. PATENT DOCUMENTS

| | | | |
|---|---|---|---|
| 4,264,641 A | 4/1981 | Mahoney et al. | |
| 5,315,793 A | 5/1994 | Peterson et al. | |
| 5,316,560 A | 5/1994 | Krone-Schmidt et al. | |
| 5,354,384 A | 10/1994 | Sneed et al. | |
| 5,377,705 A | 1/1995 | Smith, Jr. et al. | |
| 5,409,418 A | 4/1995 | Krone-Schmidt | |
| 5,561,527 A | 10/1996 | Krone-Schmidt | |
| 5,611,491 A | 3/1997 | Bowers | |
| 5,637,027 A | 6/1997 | Palumbo et al. | |
| 5,766,061 A | 6/1998 | Bowers | |
| 5,766,368 A | 6/1998 | Bowers | |
| 5,775,127 A | 7/1998 | Zito | |
| 5,796,111 A | 8/1998 | Mahoney | |
| 5,804,826 A | 9/1998 | Borden et al. | |
| 5,806,544 A | 9/1998 | Kosic | |
| 5,836,809 A | 11/1998 | Kosic | |
| 5,837,064 A | 11/1998 | Bowers | |
| 5,853,962 A | 12/1998 | Bowers | |
| 5,908,510 A | 6/1999 | McCullough et al. | |
| 5,931,721 A | 8/1999 | Rose et al. | |
| 5,961,732 A | 10/1999 | Patrin et al. | |
| 5,967,156 A * | 10/1999 | Rose et al. ............. | 134/7 |

(Continued)

OTHER PUBLICATIONS

Jointly written by: European Elect. Component Manufactures Assc., Japan Elect. & Information Tech. Industries Assc., Korea Semiconductor Industry Assc., Taiwan Semiconductor Industry Assc., Semiconductor Industry Assc. International Technology Roadmap for Semiconductors 2001 Edition *Executive Summary*—pp. 12-16.

(Continued)

*Primary Examiner*—Michael Barr
*Assistant Examiner*—Saeed Chaudhry
(74) *Attorney, Agent, or Firm*—Joshua L. Cohen

(57) ABSTRACT

The present invention is directed to the use of a high vapor pressure liquid prior to or simultaneous with cryogenic cleaning to remove contaminants from the surface of substrates requiring precision cleaning such as semiconductors, metal films, or dielectric films. A liquid suitable for use in the present invention preferably has a vapor pressure above 5 kPa and a freezing point below −50° C.

12 Claims, 2 Drawing Sheets

U.S. PATENT DOCUMENTS

| | | | |
|---|---|---|---|
| 5,989,355 A | 11/1999 | Brandt et al. | |
| 6,004,400 A | 12/1999 | Bishop et al. | |
| 6,033,484 A | 3/2000 | Mohoney | |
| 6,036,581 A | 3/2000 | Aoki | |
| 6,066,032 A | 5/2000 | Borden et al. | |
| 6,099,396 A | 8/2000 | Krone-Schmidt | |
| 6,129,091 A * | 10/2000 | Lee et al. | 134/3 |
| 6,146,466 A | 11/2000 | Bowers | |
| 6,173,916 B1 | 1/2001 | Krone-Schmidt | |
| 6,203,406 B1 | 3/2001 | Rose et al. | |
| 6,306,564 B1 | 10/2001 | Mullee | |
| 6,332,470 B1 | 12/2001 | Fishkin et al. | |
| 6,500,758 B1 | 12/2002 | Bowers | |
| 6,565,920 B1 | 5/2003 | Endisch | |
| 2003/0188763 A1 | 10/2003 | Banerjee et al. | |
| 2004/0018803 A1 | 1/2004 | Boumerzoug et al. | |
| 2004/0029494 A1 | 2/2004 | Banerjee et al. | |

OTHER PUBLICATIONS

Edited by Werner Kern, Noyes Publications, 1993. "Handbook of Semiconductor Wafer Cleaning Technology Science, Technology, and Applications"—pp. 152, 181, 182.

Edited by R.P. Donovan, Marcel Dekker Inc. "Particle Control for Semiconductor Manufacturing"—pp. 359, 361-364.

* cited by examiner

LIQUID-ASSISTED CRYOGENIC CLEANING

CROSS-REFERENCE TO RELATED APPLICATIONS

This application is a Continuation of U.S. application Ser. No. 10/324,221, filed Dec. 19, 2002, now U.S. Pat. No. 6,852,173, which claims the benefit of U.S. Provisional Application No. 60/369,853, filed Apr. 5, 2002.

FIELD OF THE INVENTION

The present invention relates to the use of a liquid, either simultaneously or sequentially, with cryogenic cleaning to aid in the removal of foreign materials, e.g. particles and other contaminants, from semiconductor surfaces, metal films, dielectric films, and other surfaces requiring precision cleaning.

BACKGROUND OF THE INVENTION

Cleaning or surface preparation of silicon wafers with or without various layers of films is very critical in integrated circuit manufacturing processes. The removal of particles and contaminants from wafer surfaces is performed at several critical process steps during the fabrication of integrated circuits. At a 0.18 μm technology node, 80 out of 400 steps or 20% of the fabrication sequence is dedicated to cleaning. The challenges of cleaning technology are multiplied by the varied types of films, topographies, and contaminants to be removed in front-end-of-line (FEOL) and back-end-of-line (BEOL) cleaning processes. Removal of particles is an important part of this cleaning.

For the defect-free manufacture of integrated circuits, the International Technology Roadmap for Semiconductors (ITRS) indicates that the critical particle size is half of a DRAM ½ pitch [1]. Thus, at the 130 nm technology node, the DRAM ½ pitch being 130 nm, the critical particle size is 65 nm. Therefore, particles larger than 65 nm size must be removed to ensure a defect-free device.

Such small particles are difficult to remove since the ratio of the force of adhesion to removal increases for smaller-sized particles. For submicron particles, the primary force of adhesion of the particles to a surface is the Van der Waals force. This force depends on the size of the particle, the distance of the particle to the substrate surface, and the Hamaker constant. The Van der Waals force for a spherical particulate on a flat substrate is given as in equation 1:

$$F_{ad} = \frac{A_{132}d_p}{12Z_0^2} \quad (1)$$

where $A_{132}$ is the Hamaker constant of the system composed of the particle, the surface and the intervening medium; $d_p$ is the particle diameter; and $Z_0$ is the distance of the particle from the surface. The Hamaker constant $A_{132}$ for the composite system is given as in equation (2):

$$A_{132} = A_{12} + A_{33} - A_{13} - A_{23} \quad (2)$$

The relationship of the Hamaker constant of two dissimilar materials is expressed as the geometric mean of the individual Hamaker constants as $A_{ij} = (A_{ii} * A_{jj})^{1/2}$ where $A_{ii}$ and $A_{jj}$ are the Hamaker constants of materials i and j. It is calculated theoretically using either the Lifshitz or the London models. The Hamaker constant for particles and surfaces used in integrated circuit manufacturing processes is given in literature [2, 3] and is less when the intervening medium is liquid as compared to air. The Van der Waals force, being directly proportional to the Hamaker constant, is therefore reduced when there is a liquid layer between the particle and the surface.

In addition to the difficulty in removing small particles from the surface, there are various types of organic and metal-organic contaminants which must be cleaned away. As an example, etching is done in integrated circuit device fabrication processes at a number of steps both in FEOL and BEOL to form patterns. The etch is often performed by reactive ion etching (RIE) which generally has a physical and a chemical component to it. Following this process, the etch residues, which are polymeric sometimes with metallic contaminants embedded inside the polymeric matrix, have to be removed. The photoresist film left behind after the etching also has to be removed prior to the next step in the integrated device fabrication process. In case of chemical-mechanical polishing, the polishing steps may use Cerria, alumina or silica slurries. After polishing, the slurry and any residues from the slurry additives need to be cleaned from the wafer surface before the next layer of film is deposited. Thus, there is a wide variety of residues, particles and other foreign materials which need to be cleaned both from the surface of the wafer as well as inside any etched features.

The prior art processes use $CO_2$ or argon cryogenic sprays for removing foreign materials from surfaces. As examples, see U.S. Pat. No. 5,931,721 entitled Aerosol Surface Processing; U.S. Pat. No. 6,036,581 entitled Substrate Cleaning Method and Apparatus; U.S. Pat. No. 5,853,962 entitled Photoresist and Redeposition Removal Using Carbon Dioxide Jet Spray; U.S. Pat. No. 6,203,406 entitled Aerosol Surface Processing; and U.S. Pat. No. 5,775,127 entitled High Dispersion Carbon Dioxide Snow Apparatus. In all of the above prior art patents, the foreign material is removed by physical force involving momentum transfer to the contaminants where the intervening medium between particle and substrate surface is air. Since the force of adhesion between the contaminant particles and the substrate is strong, the prior art processes are ineffective for removing small, <0.3 μm, particles.

U.S. Pat. No. 6,332,470, entitled Aerosol Substrate Cleaner, discloses the use of vapor only or vapor in conjunction with high pressure liquid droplets for cleaning semiconductor substrate. Unfortunately, the liquid impact does not have sufficient momentum transfer capability as solid $CO_2$ and will therefore not be as effective in removing the smaller-sized particles. U.S. Pat. No. 5,908,510, entitled Residue Removal by Supercritical Fluids, discloses the use of cryogenic aerosol in conjunction with supercritical fluid or liquid $CO_2$. Since $CO_2$ is a non-polar molecule, the solvation capability of polar foreign material is significantly reduced. Also, since the liquid or supercritical $CO_2$ formation requires high pressure (greater than 75 psi for liquid and 1080 psi for supercritical), the equipment is expensive.

As such, there remains a need for a more efficient and effective removal process of contaminants, including particles, foreign materials, and chemical residues, from the surfaces of substrates such as semiconductor wafers, metal films, dielectric films, and other substrates requiring precision cleaning.

SUMMARY OF THE INVENTION

The present invention provides for a new and improved process for the cleaning of substrate surfaces such as semiconductors and metal and dielectric films to remove contaminants.

The invention uses a high-vapor pressure liquid prior to cryogenic cleaning to reduce the Van der Waals force of adhesion of the foreign material on the surface. The liquid is sprayed onto the surface and preferably covers the surface for a short period of time. Preferably, the liquid covers the surface for at least one minute. Following this wetting period, the cryogenic spray is initiated. The presence of the liquid will reduce the force of adhesion of the contaminants on the surface thereby making it easier for the particles from the cryogenic spray to dislodge the contaminants from the surface. The liquid may also remove the bulk water from the surface prior to cryogenic cleaning, such as is used in co-pending U.S. Pat. application Ser. No. 10/215,859 filed on Aug. 9, 2002 and entitled Post CMP Cleaning Using a Combination of Aqueous and Cryogenic Cleaning. The liquid, if chosen with the correct properties, may also dissolve organic contaminants from the substrate surface. The high vapor pressure liquid may be applied simultaneously with the cryogenic cleaning.

BRIEF DESCRIPTION OF THE FIGURES

Embodiments of the present invention are described with reference to the Figures in which.

DETAILED DESCRIPTION

Figure 1:
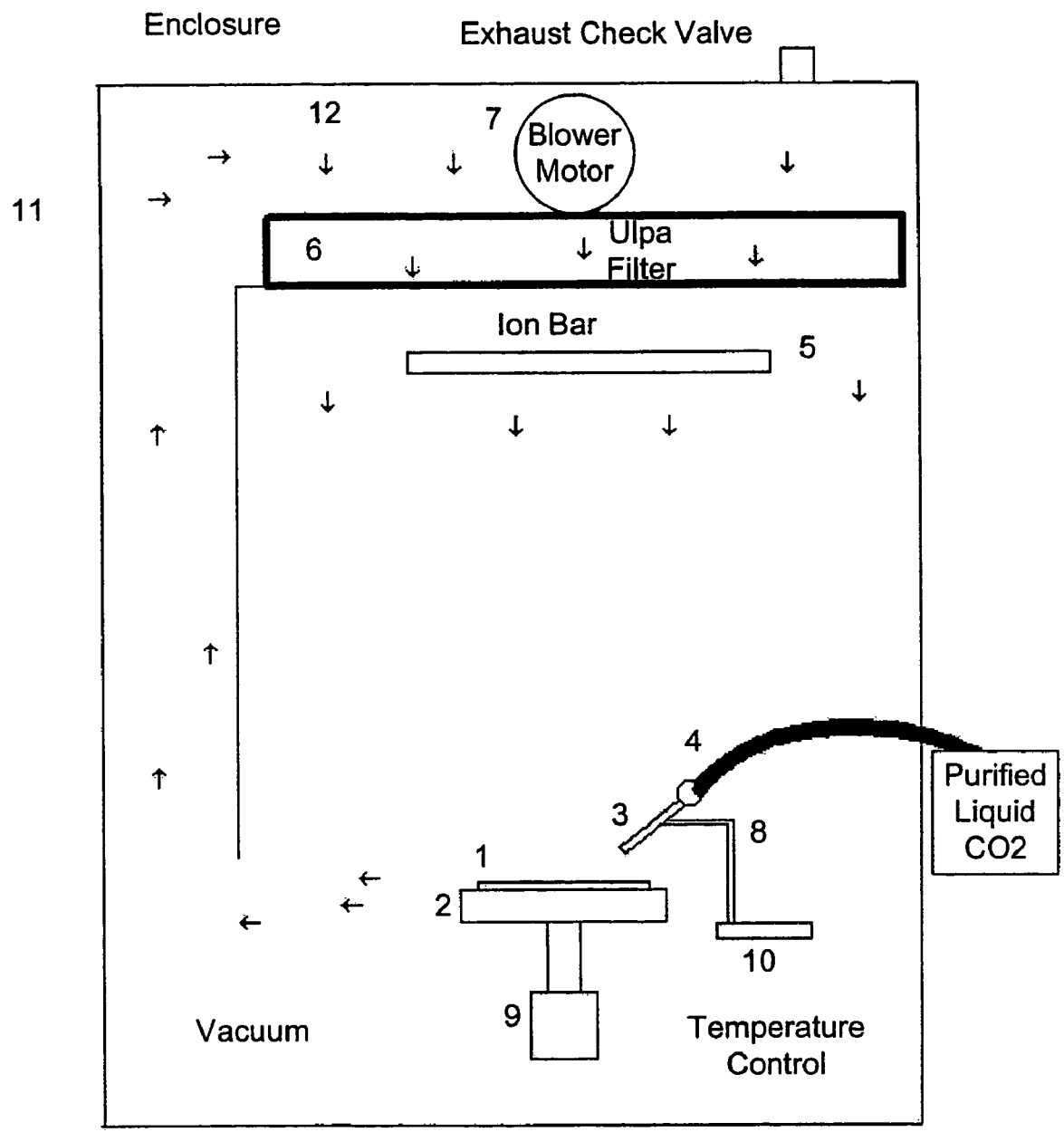
FIG. 1 is a schematic diagram of the apparatus used in standard $CO_2$ cryogenic cleaning.

The invention uses liquids having high vapor pressure to reduce the Van der Waals force between foreign material and a substrate surface such as a semiconductor wafer surface or film surface. The high vapor pressure liquid is sprayed on to the surface of the substrate. It is followed with cryogenic cleaning. The initial spraying of liquid will reduce the Van der Waals forces thereby allowing the cryogenic cleaning to more easily remove foreign material from the substrate surface. If the upstream process prior to the cryogenic cleaning is an aqueous based process, as in co-pending U.S. Pat. application Ser. No. 10/215,859,then the liquid may also remove the bulk water prior to the cryogenic cleaning. Further, the high vapor pressure. liquid may act to dissolve organic contaminants from the surface. A particular high-vapour pressure liquid will be chosen depending on the organic contaminants contained on the substrate surface. A skilled person in this field will be aware of the types of liquids which would dissolve common organic contaminants.

The liquids suitable for use in the present invention have high vapor pressures. Liquids which are suitable for use include, but are not limited to, ethanol, acetone, ethanol-acetone mixtures, isopropyl alcohol, methanol, methyl formate, methyl iodide, ethyl bromide, acetonitrile, ethyl chloride, pyrrolidine, and tetrahydrofuran. However, any liquid having a high vapor pressure may be used. High vapor pressure liquids will readily evaporate off the surface of the substrate without the need for drying by heating or spinning the substrate. The liquids also preferably have low freezing points and are polar in nature. The low freezing point of the liquids ensures that any residual liquid left on the wafer surface at the time of cryogenic cleaning will not freeze due to the drop in wafer temperature than can be attained during the cryogenic cleaning process. The polarity of the liquid aids in the dissolution of the organic and inorganic contaminants on the wafer surface. Preferably, the vapor pressure of the liquid is greater than or equal to 5 kPa at 25° C. the freezing point of the liquid is less than or equal to about −50° C. and the dipole moment is greater than about 1.5 D.

This process may be used on any substrate surface requiring precision cleaning. These surfaces include semiconductor surfaces as well as metal and dielectric films. Therefore, whenever the term "semiconductor", "metal film", "dielectric film", or "wafer" is used herein, it is intended that the same process may be applied to other substrate surfaces. Other surfaces include hard disk media, optics, GaAs substrates and films in compound semiconductor manufacturing processes. Examples provided herein are not meant to limit the present invention.

In one embodiment of the present invention, the high-vapor pressure liquid is sprayed onto the surface of a semiconductor wafer at a temperature of 30°–50° C. The liquid may be sprayed either as a thick film or as a thin layer. The layer is preferably at least 5–10 Å thick. It is preferably sprayed using a misting nozzle made of Teflon used in wet benches for spraying deionized water onto wafer surfaces. However, any other nozzle used in the art may be employed. The wafer is preferably covered with the liquid for at least one minute and preferably up to 10 minutes. The liquid may be applied onto the surface once during this time period or it may be sprayed multiple times to ensure that the wafer surface remains wet. As well, the wafer may be rotated at approximately 100 rpm while the liquid is sprayed onto it to ensure uniform coverage of the wafer surface.

Following this wetting period, the $CO_2$ cryogenic spraying is initiated. Cryogenic spraying processes may use carbon dioxide, argon or other gases and are well known within the art. Any known technique may be used. The result of the initial high vapor pressure liquid application is the reduction of the Hamaker constant and hence the Van der Waals forces. This application lowers the forces of adhesion of the foreign material to the wafer surface and the foreign material is easier to remove from the wafer surface than through the use of only cryogenic cleaning. It also removes bulk water in a prior aqueous cleaning process.

A standard $CO_2$ cryogenic cleaning process is described in U.S. Pat. No. 5,853,962, which is incorporated herein by reference. As an example of a typical $CO_2$ cryogenic cleaning system, reference is made to the system 11 shown in FIG. 1. This system comprises a cleaning container 12 in which system gases are circulated in the general direction indicated by the arrows in FIG. 1. The cleaning container 12 provides an ultra clean, enclosed or sealed cleaning zone. Ultra cleanliness of the cleaning zone may be achieved by virtue of means, such as a blower motor 7, for passing system gases through an ultra purification filter, such as an ultra low particulate air (ULPA) filter 6, as shown in FIG. 1. A wafer 1 is held on a platen 2 by vacuum within the cleaning zone. The platen 2 beneath the wafer 1 is kept at a controlled temperature of up to 100° C. Liquid $CO_2$, from a cylinder at room temperature and 850 psi, is first passed through a sintered in-line filter 4 to filter out very small particles from the liquid stream to render the carbon dioxide as pure as possible and to reduce contaminants in the stream. The liquid $CO_2$ is then made to expand through a small aperture nozzle 3, preferably of from 0.05" to 0.15" in diameter. The rapid expansion of the liquid causes the temperature to drop, resulting in the formation of solid $CO_2$ snow particles entrained in a gaseous $CO_2$ stream flowing at a rate of approximately 1–3 cubic feet per minute. The stream of solid and gaseous $CO_2$ is directed at the wafer surface at an angle of about 30° to about 60°, preferably at an angle of about 45°. The nozzle is preferably positioned at a distance of approximately 0.375" to 0.5" measured along the line of sight of the nozzle to the wafer surface. During the cleaning process, the platen 2 moves back and forth on track 9 in the y direction while the arm 8 of the cleaning nozzle moves linearly on the track 10 in the x direction. This results in a rastered cleaning pattern on the wafer surface of which the step size and scan rate can be pre-set as desired. The humidity in the cleaning chamber is preferably maintained as low as possible, for example, <−40° C. dew point. The low humidity is present to prevent the condensation and freezing of the water on the wafer surface from the atmosphere during the cleaning process which would increase the force of adhesion between the contaminant particles and the wafer surface by forming crystalline bridges between them. The low humidity can be maintained by the flow of nitrogen or clean dry air.

As well, throughout the cleaning process, it is important that the electrostatic charge in the cleaning chamber be neutralized. This is done by the bipolar corona ionization bar 5. The system also has a polonium nozzle mounted directly behind the $CO_2$ nozzle for enhancing the charge neutralization of the wafer which is mounted on an electrically grounded platen. The electrostatic charge develops by triboelectrification due to the flow of $CO_2$ through the nozzle It is desirable to remove particulate contaminants, such as particulate contaminants that are submicron in size, such as less than or equal to about 0.76 μm in size, from the wafer surface. For particular contaminants, the removal mechanism is primarily by momentum transfer of the $CO_2$ cryogenic particles to overcome the force of adhesion of the contaminant particles on the wafer surface. Once the particles are "loosened", the drag force of the gaseous $CO_2$ removes them from the surface of the wafer. It is also desirable to remove organic film contaminants from the wafer surface. The cleaning mechanism for organic film contaminants is by the formation of a thin layer of liquid $CO_2$ at the interface of the organic contaminants and the surface due to the impact pressure of the cryogenic $CO_2$ on the wafer surface. The liquid CO can then dissolve the organic contaminants and carry them away from the wafer surface.

Alternatively, the liquid can be applied simultaneously with the $CO_2$ cryogenic cleaning. In such a case, a second nozzle for spraying the liquid would be mounted in conjunction with a first nozzle used for $CO_2$ cryogenic cleaning. The liquid would preferably be applied in a thin layer and the $CO_2$ cryogenic cleaning would continue simultaneously with the spraying of the liquid onto the substrate.

Figure 2:
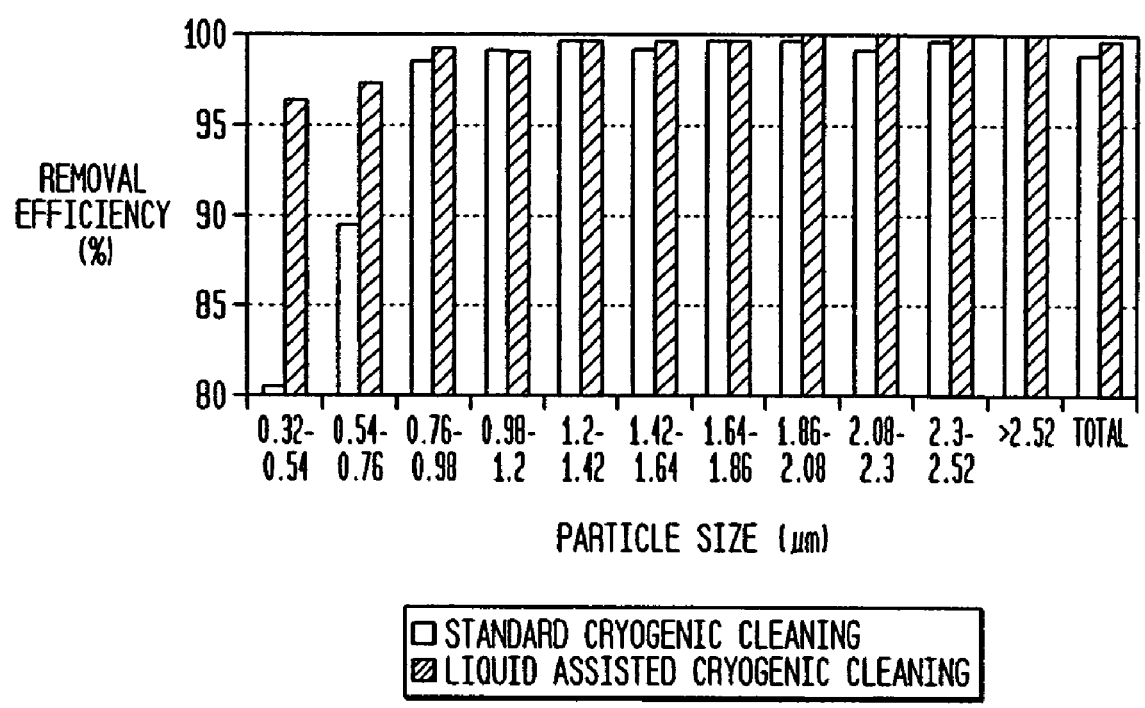
FIG. 2 is a graph showing the efficiency of particle removal compared to particle size for both standard cryogenic cleaning and the present liquid-assisted cleaning process.

As a result of the use of the high vapor pressure liquid, the removal of particle contaminants by cryogenic cleaning is significantly improved. FIG. 2 shows the efficiency of particle removal compared to particle size for both standard cryogenic cleaning as well as liquid-assisted cryogenic cleaning. Removal of particles having a size below 0.76 μm is significantly improved with the use of the present liquid assisted $CO_2$ cryogenic cleaning process rather than standard $CO_2$ cryogenic cleaning. For particle sizes ranging from 0.98 μm to 2.50 μm, there was no significant difference in the removal of particles between the use of the present liquid assisted cryogenic cleaning and the standard $CO_2$ cryogenic cleaning process.

The embodiments and examples of the present application are meant to be illustrative of the present invention and not limiting. Other embodiments which could be used in the present process would be readily apparent to a skilled person. It is intended that such embodiments are encompassed within the scope of the present invention.

REFERENCES

[1]. *International Technology Roadmap for Semiconductors* 2001 Edition.
[2]. *Handbook of Semiconductor Wafer Cleaning Technology Science, Technology and Applications*, Edited by Werner Kern, Noyes Publications, 1993.
[3]. *Particle Control for Semiconductor Manufacturing*, Edited by R. P. Donovan, Marcel Dekker Inc., 1990.

The invention claimed is:

1. A method for removing at least one contaminant from a substrate, comprising:
    heating the substrate;
    applying cryogenic material to the heated substrate; and
    applying at least one liquid to react with the at least one contaminant on the heated substrate.

2. The method according to claim 1 further comprising removing the at least one contaminant from the heated substrate.

3. The method according to claim 1, wherein a temperature of the cryogenic material does not exceed a temperature of the heated substrate.

4. The method according to claim 1, wherein said heating the substrate and said applying the cryogenic material occur simultaneously.

5. The method according to claim 1, wherein said heating the substrate and said applying the cryogenic material occur sequentially.

6. The method according to claim 1, wherein the at least one liquid has a vapor pressure greater than or equal to 5 kPa at 250° C.

7. The method according to claim 1, wherein the at least one liquid has a freezing point of less than or equal to about −50° C.

8. The method according to claim 1, wherein the at least one liquid has a dipole moment of greater than about 1.5 D.

9. The method according to claim 1, wherein the at least one liquid is selected from ethanol, acetone, ethanol-acetone mixtures, isopropyl alcohol, methanol, methyl fonnate, methyl iodide, ethyl bromide, acetonitrile, ethyl chloride, pyrrolidine, tetrahydrofuran, and any combination thereof.

10. The method according to claim 1, wherein during said applying the at least one liquid the surface is rotated.

11. The method according to claim 1, wherein said applying cryogenic material comprises directing a stream of gaseous and particulate cryogenic material at the surface.

12. A method for removing at least one contaminant from a substrate surface, comprising:
    applying cryogenic material to the substrate surface being at a heated temperature; and
    applying at least one liquid to react with the at least one contaminant on the heated substrate surface.

* * * * *

UNITED STATES PATENT AND TRADEMARK OFFICE
CERTIFICATE OF CORRECTION

PATENT NO. : 7,056,391 B2 Page 1 of 1
APPLICATION NO. : 10/886251
DATED : June 6, 2006
INVENTOR(S) : Souvik Banerjee and Harlan Forrest Chung It is certified that error appears in the above-identified patent and that said Letters Patent is hereby corrected as shown below:

Column 6

Line 42, Please replace " 250° C. " with --25° C.--.

Column 6

Line 50, Please replace "fonnate" with --formate--.

Signed and Sealed this

Nineteenth Day of September, 2006

JON W. DUDAS
*Director of the United States Patent and Trademark Office*